United States Patent
Guo

(10) Patent No.: US 11,114,611 B2
(45) Date of Patent: Sep. 7, 2021

(54) METHOD TO MAKE MRAM WITH SMALL FOOTPRINT

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 0 days.

(21) Appl. No.: 14/678,370

(22) Filed: Apr. 3, 2015

(65) Prior Publication Data

US 2016/0293835 A1    Oct. 6, 2016

(51) Int. Cl.
*H01L 43/08* (2006.01)
*H01L 43/12* (2006.01)
*H01L 27/22* (2006.01)

(52) U.S. Cl.
CPC ............ *H01L 43/12* (2013.01); *H01L 27/222* (2013.01); *H01L 43/08* (2013.01)

(58) Field of Classification Search
CPC ......... H01L 43/08; H01L 43/10; H01L 43/02; H01L 43/04; H01L 43/06
USPC .................................................. 257/421, 422
See application file for complete search history.

(56) References Cited

U.S. PATENT DOCUMENTS

| | | | | |
|---|---|---|---|---|
| 2010/0258888 A1* | 10/2010 | Horng | .................... | B82Y 25/00 257/421 |
| 2012/0261777 A1* | 10/2012 | Shukh | .................... | H01L 43/08 257/421 |
| 2014/0264673 A1* | 9/2014 | Kitagawa | ................ | H01L 43/10 257/421 |

* cited by examiner

*Primary Examiner* — Cuong Q Nguyen

(57) ABSTRACT

A method to make magnetic random access memory with small footprint using O-ion implantation to form electrically isolated memory pillar and electric (bottom and top) leads, which are made from some oxygen gettering materials, Mg, Zr, Y, Th, Ti, Al, Ba. The doped O-ions react with metal atoms to form fully oxidized metal oxide after high temperature anneal. The method only needs two photolithography patterning and oxygen implantations and no etch and dielectric refill are needed, thus significantly reduce process cost. The method can produce extremely small MRAM cell size with perfectly vertical pillar edges (FIG. 1).

15 Claims, 5 Drawing Sheets

METHOD TO MAKE MRAM WITH SMALL FOOTPRINT

BACKGROUND OF THE INVENTION

1. Field of the Invention

This invention relates generally to spin-electronic devices with a small footprint, more particularly to a magnetic tunnel junction and methods for making the same.

2. Description of the Related Art

Magnetoresistive elements having magnetic tunnel junctions (also called MTJs) have been used as magnetic sensing elements for years. In recent years, magnetic random access memories (hereinafter referred to as MRAMs) using the magnetoresistive effect of MTJ have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element, both two magnetization films have easy axis of magnetization in a direction perpendicular to the film plane due to their strong magnetic crystalline anisotropy, shape anisotropies are not used, and accordingly, the device shape can be made smaller than that of an in-plane magnetization type. Also, variance in the easy axis of magnetization can be made smaller. Accordingly, by using a material having a large magnetic crystalline anisotropy, both miniaturization and lower currents can be expected to be achieved while a thermal disturbance resistance is maintained.

There has been a known technique for achieving a high MR ratio in a perpendicular magnetoresistive element by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved. However, where a MTJ is formed as a device of a perpendicular magnetization type, the materials of the recording layer typically used in an in-plane MTJ for both high MR and low damping constant as required by low write current application normally don't have enough magnetic crystalline anisotropy to achieve thermally stable perpendicular magnetization against its demagnetization field. In order to obtain perpendicular magnetization with enough thermal stability, the recording layer has to be ferromagnetic coupled to additional perpendicular magnetization layer, such as TbCoFe, or CoPt, or multilayer such as (Co/Pt)n, to obtain enough perpendicular anisotropy. Doing so, reduction in write current becomes difficult due to the fact that damping constant increases from the additional perpendicular magnetization layer and its associated seed layer for crystal matching and material diffusion during the heat treatment in the device manufacturing process.

In a spin-injection MRAM using a perpendicular magnetization film, a write current is proportional to the perpendicular anisotropy, the damping constant and inversely proportional to a spin polarization, and increases in proportional to a square of an area size. Therefore, reduction of an area size is mandatory technologies to reduce the write current.

Besides a write current, the stability of the magnetic orientation in a MRAM cell as another critical parameter has to be kept high enough for a good data retention, and is typically characterized by the so-called thermal factor which is proportional to the perpendicular anisotropy as well as the volume of the recording layer cell size. Although a high perpendicular anisotropy is preferred in term of a high thermal disturbance resistance, an increased write current is expected as a cost.

To record information or change resistance state, typically a recording current is provided by its CMOS transistor to flow in the stacked direction of the magnetoresistive element, which is hereinafter referred to as a "vertical spin-transfer method." Generally, constant-voltage recording is performed when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

In the mean time, since the switching current requirements reduce with decreasing MTJ element dimensions, STT-MRAM has the potential to scale nicely at even the most advanced technology nodes. However, making of small MTJ element leads to increasing variability in MTJ resistance and sustaining relatively high switching current or recording voltage variation in a STT-MRAM.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ. Majorities of cell-to-cell variations come from the MTJ cell patterning process.

The MTJ patterning process becomes one of the most challenging aspects of manufacturing. Conventional techniques utilized to pattern small dimensions in a chip, such as ion milling etching (IBE) or reactive ion etching (RIE), having been less than satisfactory when applied to magnetic tunnel junction stacks used for MRAM. In most cases when these techniques are used, it is very difficult or almost impossible to cleanly remove etched materials without partial damages to magnetic tunnel junction properties and electric current shunting. In a RIE etching of magnetic material, physical sputtering is still the major component which unavoidable results in the formation of re-deposited residues that can short circuit the junctions of the MTJ or create shunting channel of the MTJ, yielding high resistance variations and serious reliability issues.

Another problem of conventional patterning techniques is the degradation of the recording layer and reference layer in the MTJ, due to corrosion caused by chemical residue remaining after etching. Exposure to reactive gases during refilling deposition of dielectrics such as silicon dioxide or silicon nitride after the MTJ etching can also cause corrosion. After refilling of dielectric material, a chemical mechanic polishing process is required to smooth out the top surface for bit line fabrication, which introduces a big manufacturing challenging as well as high cost and further corrosion.

The current fabrication method to form STT-MRAM is by etching and dielectric refilling. Due to the non-volatile nature of the etched magnetic materials, the sensor profile is typically sloped with small top (230) and large bottom (210, FIG. 2, prior art). As the result, the formed sensor size cannot be made small enough to reduce the current for information writing. Often the etched sensor edge got damaged with electrical shorting across the MgO barrier (220).

Thus, it is desirable to provide a greatly improved method or innovative method that enables well-controllable and low cost fabrication in MTJ patterning while eliminating damage, degradation and corrosion.

BRIEF SUMMARY OF THE PRESENT INVENTION

The present invention is to make magnetic random access memory with small footprint using O-ion implantation to form electrically isolated memory pillar and electric (bottom and top) leads, which are made from some oxygen gettering materials, Mg, Zr, Y, Th, Ti, Al, Ba. The doped O-ions react with metal atoms to form fully oxidized metal oxide after high temperature anneal. The method only needs two photolithography patterning and oxygen implantations and no etch and dielectric refill are needed, thus significantly reduce process cost. The method can produce extremely small MRAM cell size with perfectly vertical pillar edges (FIG. 1).

According to the current invention, an MTJ stack is formed on a substrate, the MTJ consists of a recording layer, a reference layer and a MgO tunnel barrier layer disposed between the recording layer and the reference layer, a protective cap layer and an optional MgO intermediate layer provided on a surface of the recording layer, which is opposite to a surface of the recording layer where the tunnel barrier layer is provided, and there is provided a method of patterning a magnetic tunnel junction which comprises:
  forming an ion implantation hard mask in the first direction on the cap layer;
  ion-implanting oxygen atoms into the entire film stack from a surface exposed in the opening of the mask;
  forming an ion implantation hard mask in the second direction on the cap layer;
  ion-implanting oxygen atoms into the entire film stack from a surface exposed in the opening of the mask in the second direction;
  carrying out a thermal annealing with respect to the substrate to oxidize an ion implantation region and re-crystallized MgO layer so that a highly oxidized MgO layer having a greatly increased resistance is formed and an oxidized recording layer having a highly increased resistance and zero or near zero magnetization moment is formed in the opening of the mask; and
  forming a dielectric region outside of the photo-mask on the substrate and a functional magnetoresistive element underneath the photo-mask on the substrate.

DETAILED DESCRIPTION OF THE INVENTION

Figure 1:
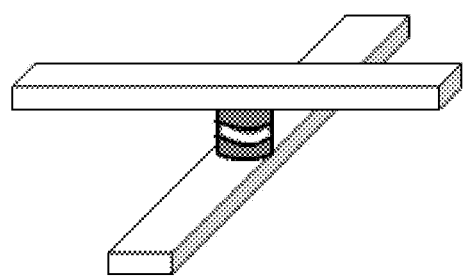
FIG. 1 Schematic view of the small STT-MRAM cell disclosed in this invention.
Figure 2:
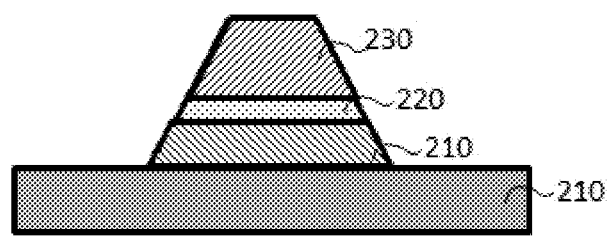
FIG. 2 Prior art—Cross section of a typical MRAM cell made by etching or milling.
Figure 3:
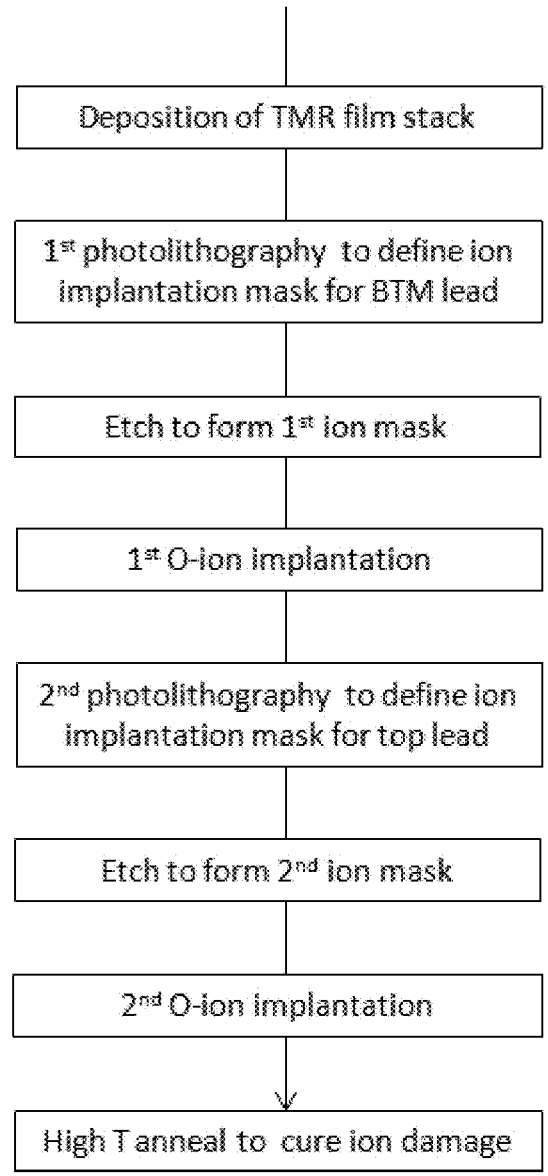
FIG. 3 Process flow to make small MRAM cell using ion implantation.

To solve the problem of the etching and refilling during STT-MRAM fabrication, we use ion implantation to inject oxygen ions into the desired deep film layers to covert the conducting metals into metal oxides, leaving only those areas protected by ion mask with unchanged magnetic property. The process flow is shown in FIG. 3.

Various embodiments will be described hereinafter with reference to the companying drawings. The drawings are schematic or conceptual, and the relationships between the thickness and width of portions, the proportional coefficients of sizes among portions, etc., are not necessarily the same as the actual values thereof.

Figure 4:
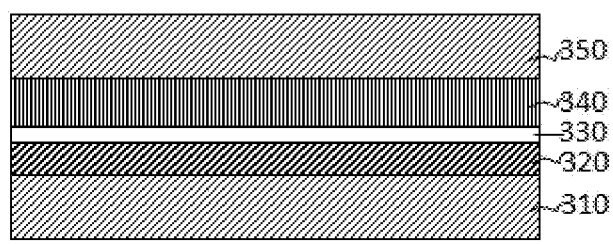
FIG. 4 STT-MRAM film stack is deposited in one vacuum pump down.

First, a full TMR film stack is deposited on the wafer with control CMOS already built in (FIG. 4), beginning at bottom electrode (310), magnetic memory layer (320), MgO tunneling barrier (330), magnetic reference layer (340) and top electrode (350). Here the material selection for bottom and top electrode is crucial. The material itself should have good electrical conduction, and can be easily changed into electrically insulating dielectric material when oxygen is added in. Typical lead materials are Mg, Zr, Y, Th, Ti, Al, Ba. For perpendicular spin torque transfer magnetic random access memory (STT-MRAM), the memory material is typically a thin (<15A) CoFeB, and reference material is typically CoPt, CoPd, CoTb, FePt, FePd, FeTb or combination of them or multi-layer of Co/Pt, or Co/Pd. To control the resistance-area (RA of the device), MgO may be partially oxidized by natural or plasma oxidation.

Figure 5A:
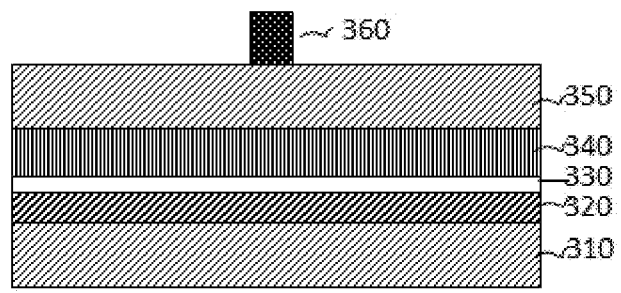
FIG. 5A First photolithography patterning with a line mark is created, a cross section view.
Figure 5B:
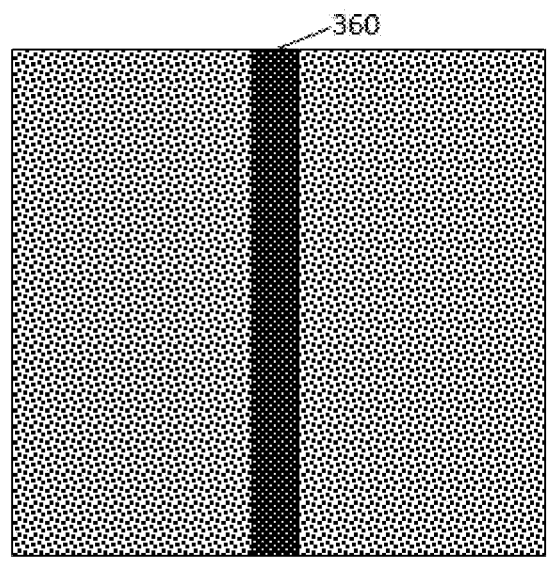
FIG. 5B First photolithography patterning with a line mark is created, a top view.
Figure 6A:
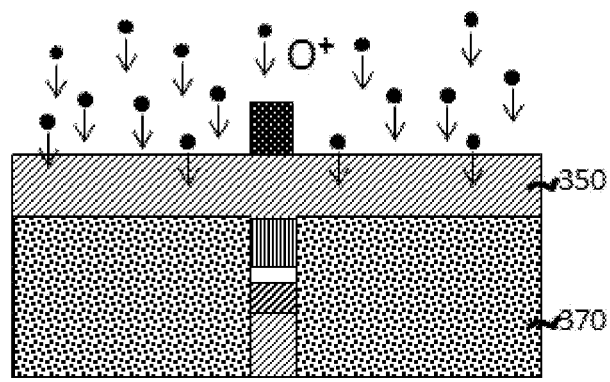
FIG. 6A Half formed STT-MRAM cell by O-ion implantation with a line mask protected digital conductive line at the bottom, a cross section view.
Figure 6B:
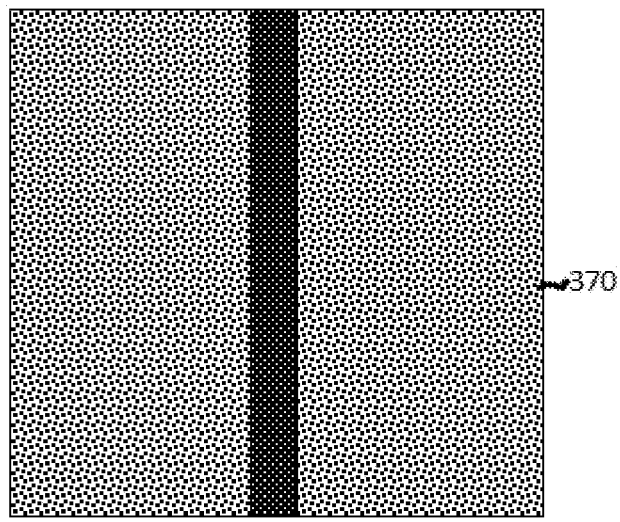
FIG. 6B Half formed STT-MRAM cell by O-ion implantation with a line mask protected digital conductive line at the bottom, a top view.

Second, a photolithography patterning is used to form a mask stripe (360) of bottom electrode (FIG. 5A a cross section view, and FIG. 5B a top view). Then, ion implantation is used to implant O-ions into the layers starting from bottom electrode (310) until the magnetic reference layer (340) by varying the implanter's acceleration voltage, and only keep the photoresist-protected stripe area un-changed which will be bottom electrode line [FIG. 6A a cross section view, and FIG. 6B a top view]. The top Mg layer (350) is also un-changed because all of the high energy O-ions pass through it without stopping there although there may be some damage created (which can be repaired during high temperature anneal). It is very crucial to select correct range of the acceleration energy for the impinging O-ions so that only the needed layer of materials (370) can capture the oxygen ions.

Figure 7A:
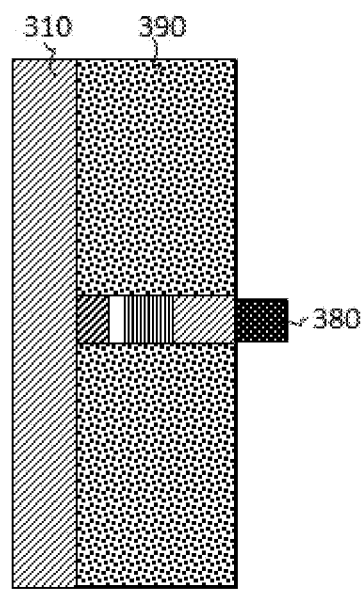
FIG. 7A Formed STT-MRAM cell by $2^{nd}$ O-ion implantation with a line mask protected top bit line, a cross section view.
Figure 7B:
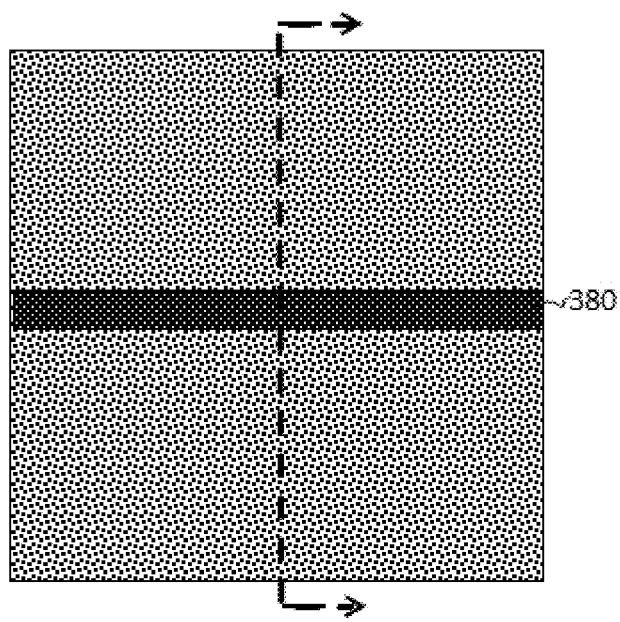
FIG. 7B Formed STT-MRAM cell by $2^{nd}$ O-ion implantation with a line mask protected top bit line, a top view.

Then a second photolithography patterning is used to form a stripe mask (380) in a cross direction (90 deg) with respect the first photo patterning. Another oxygen ion implantation is performed using different range of acceleration energy so that the oxygen ions do not penetrate into the bottom electrode layer (310) in the un-protected area and stop in the remaining layer up to the top 390 (FIG. 7A a cross section view, FIG. 7B a top view).

Finally, a high temperature anneal is used to activate M-O bonding and to repair the crystalline damage due to the above two ion implantations. The temperature range can be chosen between 250 C-800 C in vacuum or inert gas environment and the annealing time should short (30 seconds to 30 minutes). In general, the higher the annealing temperature, the shorter is the annealing time.

Figure 8:
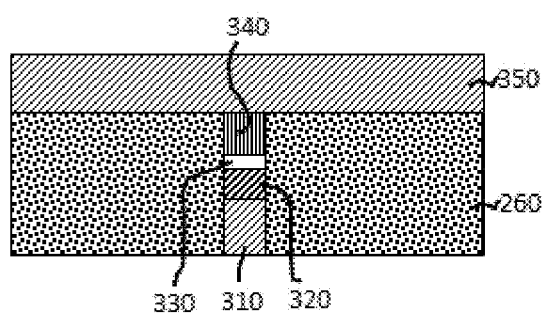
FIG. 8 Cross section of the fully formed STT-MRAM cell.

As compared with the traditional etching and dielectric refilling process, ion implantation process described above can form very small memory feature with perfectly vertical pillar edges (FIG. 8). The process is also much simpler and cost-less than the conventional etching/refilling process.

The invention claimed is:

1. A method to make a high density magnetic random access memory (HDMRAM) comprising:
   a deposition process of a magnetic tunnel junction (MTJ) multilayer film on a substrate surface connecting VIAs of select transistors of a control circuitry;
   a doping process of oxygen gettering materials into the MTJ multilayer film;
   a first photolithography patterning process to form a first hard mask in a first direction on the MTJ multilayer film;
   a first oxygen ion implantation process to implant oxygen atoms into the MTJ multilayer film regions uncovered by the first hard mask;
   a second photolithography patterning process to form a second hard mask in a second direction on the MTJ multilayer film;
   a second oxygen ion implantation process to implant oxygen atoms into the MTJ multilayer film regions uncovered by the second hard mask;
   a thermal annealing process for oxidizing and transforming the MTJ multilayer film regions uncovered by either the first hard mask or the second hard mask into electrical insulation regions on the substrate and forming small footprint MRAM elements covered by both the first hard mask and the second hard mask, and a high density MTJ array.

2. The element of claim 1, wherein the MTJ multilayer film comprises:
   a bottom electrode layer (BEL) atop the substrate surface;
   a magnetic memory layer (MML) atop the BEL;
   an MgO dielectric tunneling layer (DTL) atop the MML;
   a magnetic reference layer (MRL) atop the DTL; and
   a top electrode layer (TEL) atop the MRL.

3. The element of claim 1, wherein the MTJ multilayer film comprises
   a bottom electrode layer (BEL) atop the substrate surface;
   a magnetic reference layer (MRL) atop the BEL;
   an MgO dielectric tunneling layer (DTL) atop the MRL;
   a magnetic memory layer (MML) atop the DTL;
   an MgO intermediate layer (IL) atop the MML;
   a cap layer (CL) atop the IL; and
   a top electrode layer (TEL) provided on the surface of the CL.

4. The element of claim 2, wherein the BEL and TEL comprise one or more of Mg, Zr, Y, Th, Ti, Al, and Ba, but preferably Mg.

5. The element of claim 2, wherein the MML comprises one or more of CoFeB and CoFeB/CoFe.

6. The element of claim 2, wherein the MRL comprises one or more of CoPt, CoPd, CoTb, FePt, FePd, FeTb, multi-layer of one or more of (Co/Pt)n and (Co/Pd)n.

7. The element of claim 1, wherein said first ion mask comprises a first heavy atom material; said second ion mask comprises a second heavy atom material.

8. The element of claim 7, wherein the first heavy atom material and the second heavy atom material comprise one or more of Ta and W.

9. The element of claim 3, wherein the BEL and TEL comprise one or more of Mg, Zr, Y, Th, Ti, Al, and Ba, but preferably Mg.

10. The element of claim 3, wherein the MML is comprises one or more of CoFeB and CoFeB/CoFe.

11. The element of claim 3, wherein the MRL comprises one or more of CoPt, CoPd, CoTb, FePt, FePd, FeTb, multi-layer of one or more of (Co/Pt)n and (Co/Pd)n.

12. The element of claim 3, wherein the CL comprises one or more of thin metal layers.

13. The method of claim 1, wherein the high temperature anneal process comprises a thermal annealing of the HDM-RAM in a vacuum to cure damages as side effects occurred during oxygen ion implantation with a high temperature for a time duration.

14. The element of claim 13, wherein said high temperature of the high temperature anneal process is between 250 degrees C. to 800 degrees C.

15. The element of claim 13, wherein said time duration of the high temperature anneal process is between 30 second to 30 minutes.

* * * * *